(12) United States Patent
Schoner et al.

(10) Patent No.: US 12,476,149 B2
(45) Date of Patent: *Nov. 18, 2025

(54) CRYSTAL EFFICIENT SIC DEVICE WAFER PRODUCTION

(71) Applicant: II-VI ADVANCED MATERIALS, LLC, Pine Brook, NJ (US)

(72) Inventors: Adolf Schoner, Hässelby (SE); Sergey Reshanov, Upplands Väsby (SE)

(73) Assignee: II-VI ADVANCED MATERIALS, LLC, Pine Brook, NJ (US)

(*) Notice: Subject to any disclaimer, the term of this patent is extended or adjusted under 35 U.S.C. 154(b) by 0 days.

This patent is subject to a terminal disclaimer.

(21) Appl. No.: 18/645,895

(22) Filed: Apr. 25, 2024

(65) Prior Publication Data

US 2024/0274468 A1  Aug. 15, 2024

Related U.S. Application Data

(63) Continuation of application No. 17/595,173, filed as application No. PCT/EP2020/064195 on May 20, 2020, now Pat. No. 11,996,330.

(30) Foreign Application Priority Data

May 23, 2019   (SE) .................................. 1950611-2

(51) Int. Cl.
*H01L 21/78* (2006.01)
*H01L 21/02* (2006.01)
(Continued)

(52) U.S. Cl.
CPC .... *H01L 21/7813* (2013.01); *H01L 21/02032* (2013.01); *H01L 21/304* (2013.01); *H10D 62/8325* (2025.01)

(58) Field of Classification Search
CPC ........... H01L 21/7813; H01L 21/02032; H01L 21/304; H01L 29/1608; H01L 21/02013;
(Continued)

(56) References Cited

U.S. PATENT DOCUMENTS 8,435,897 B2   5/2013 Alami-Idrissi et al.
10,562,130 B1*  2/2020 Donofrio ............. B23K 26/032
(Continued)

FOREIGN PATENT DOCUMENTS

CN    103346079 A    10/2013
CN    104718599 A    6/2015
(Continued)

OTHER PUBLICATIONS

"International Search Report and Written Opinion issued in PCT/EP2020/064195 mailed Sep. 16, 2020".

*Primary Examiner* — Cuong B Nguyen
(74) *Attorney, Agent, or Firm* — Blank Rome LLP

(57) ABSTRACT

There is provided a method for manufacturing a SiC device wafer comprising the steps: a) slicing and polishing a SiC boule to thicker substrates compared to the usual thickness in the prior art, b) creating a device wafer on the substrate, c) removing the device wafer from the remaining substrate, d) adding SiC to the remaining substrate so that the original thickness of the substrate is essentially restored, and repeating steps b)-d). The removal of the device wafer can be made for instance by laser slicing. Advantages include that the SiC material loss is significantly decreased and the boule material used for device wafers is considerably increased, the substrates become more stable especially during high temperature processes, the warp and bow is reduced, the risk of breakage is decreased.

15 Claims, 4 Drawing Sheets

(51) Int. Cl.
*H01L 21/304* (2006.01)
*H10D 62/832* (2025.01)

(58) Field of Classification Search
CPC ......... H01L 21/02378; H01L 21/02529; H01L 21/268; H01L 21/02016; H01L 29/02; Y02P 80/30

See application file for complete search history.

(56) References Cited

U.S. PATENT DOCUMENTS

| | | | |
|---|---|---|---|
| 11,996,330 | B2 * | 5/2024 | Schöner ................ H01L 21/304 |
| 2006/0108325 | A1 | 5/2006 | Everson et al. |
| 2011/0266655 | A1 | 11/2011 | Mitani et al. |
| 2014/0264374 | A1 | 9/2014 | Hecht et al. |
| 2015/0214040 | A1 | 7/2015 | Celler |
| 2016/0193691 | A1 | 7/2016 | Hirata et al. |
| 2018/0237947 | A1 | 8/2018 | Hirata |
| 2019/0067425 | A1 | 2/2019 | Rupp et al. |

FOREIGN PATENT DOCUMENTS

| | | |
|---|---|---|
| DE | 102015217288 A1 | 3/2016 |
| WO | 2013031868 A1 | 3/2013 |
| WO | 2013115352 A1 | 8/2013 |
| WO | 2016007582 A1 | 1/2016 |
| WO | 2016083610 A2 | 6/2016 |
| WO | 2017167614 A1 | 10/2017 |
| WO | 2019030247 A1 | 2/2019 |

* cited by examiner

CRYSTAL EFFICIENT SIC DEVICE WAFER PRODUCTION

This application is a continuation of U.S. patent application Ser. No. 17/595,173, filed Nov. 10, 2021, which is a national stage of International Patent Application No. PCT/EP2020/064195, filed May 20, 2020, which claims priority to Swedish Application No. 1950611-2 filed May 23, 2019, the entire contents of which are hereby incorporated by reference herein.

TECHNICAL FIELD

The present invention relates to a method of manufacturing device wafers in SiC in a cost efficient way by slicing off wafers and adding material.

BACKGROUND

Laser Lift Off or laser slicing is a known process sometimes referred to as the KABRA process. Such technology can be purchased commercially today.

US 2014/264374 discloses a method for manufacturing SiC-wafers where the substrate is used several times.

US2015/214040 discloses manufacture of SiC wafers where a substrate can be used several times.

WO 2019/030247 discloses a production facility for detaching wafers from donor substrates.

WO 2017/167614 discloses a method for detaching at least one solid body layer from a solid body, wherein by means of the modifications a crack-guiding region is provided for guiding a crack in order to detach a solid body portion, in particular a solid body layer, from the solid body.

WO 2016/083610 discloses a method for creating a detachment zone in a solid in order to detach a solid portion, especially a solid layer, from the solid, said solid portion that is to be detached being thinner than the solid from which the solid portion has been removed. According to the invention, the method comprises at least the steps of: providing a solid which is to be processed and which is preferably made of a chemical compound; providing a LASER light source; subjecting the solid to LASER radiation from the LASER light source so that the laser beams penetrate into the solid via a surface of the solid portion that is to be cut off; the LASER radiation is applied in a defined manner to a predefined portion of the solid (I) inside the solid (I) such that a detachment zone or a plurality of partial detachment zones is formed; the method is characterized in that a number of modifications is successively created in the crystal lattice by the applied laser radiation, and the crystal lattice fissures at least partially in the regions surrounding the modifications as a result of the modifications, said fissures in the region of the modifications predefining the detachment zone or a plurality of partial detachment zones.

US 2016/0193691 discloses manufacturing of a hexagonal single crystal wafer from a hexagonal single crystal ingot. A separation start point is formed by setting a focal point of a laser beam inside the ingot at a predetermined depth from the upper surface of the ingot, which depth corresponds to a thickness of the wafer to be produced. The laser beam is applied to the upper surface of the ingot while relatively moving the focal point and the ingot to thereby form a modified layer parallel to the upper surface of the ingot and form cracks extending from the modified layer along a c-plane, thus forming a separation start point. The wafer is separated by immersing the ingot in water and then applying ultrasonic vibration to the ingot, thereby separating a plate-shaped member having a thickness corresponding to the thickness of the wafer from the ingot.

The methods disclosed in US 2016/0193691, WO 2019/030247, WO 2017/167614 and WO 2016/083610 are sometimes referred to as laser slicing or laser lift off and the disclosures are explicitly incorporated herein by reference in their entirety.

US 20110266655 discloses a method for producing a semiconductor wafer having a multilayer film, in production of a semiconductor device by the steps of forming a porous layer on a surface of a semiconductor wafer by changing a surface portion of the semiconductor wafer into the porous layer, forming a semiconductor film on a surface of the porous layer to produce the semiconductor wafer having a multilayer film, fabricating a device on the semiconductor film, and producing the semiconductor device by delaminating the semiconductor film along the porous layer, the semiconductor film having the device formed thereon; comprising at least: flattening a surface of a porous layer side of the semiconductor wafer after delaminating the semiconductor film having the device formed thereon, the porous layer being used for the delamination, and reusing the flattened semiconductor wafer as the semiconductor wafer for forming the porous layer to perform the steps of forming the porous layer and of forming the semiconductor film; the method further comprising a thickness adjusting step of adjusting a whole thickness of the semiconductor wafer having a multilayer film to be produced by reusing the semiconductor wafer so as to satisfy a predetermined standard.

US 20190067425 discloses a method for producing a silicon carbide component, the method comprising forming a silicon carbide layer on an initial wafer; forming a doping region of the silicon carbide component to be produced in the silicon carbide layer; forming an electrically conductive contact structure of the silicon carbide component to be produced on a surface of the silicon carbide layer, the electrically conductive contact structure electrically contacting the doping region; and splitting at least one from the silicon carbide layer and the initial wafer after forming the electrically conductive contact structure, such that a silicon carbide substrate at least of the silicon carbide component to be produced is split off.

Even though the methods of the prior art are used successfully today there is room for an improvement for instance with regard to:

the wafering loss in the substrate production, the ease and stability of processing substrates especially in high temperature processes, the warp and bow as measured according to ASTM F657 and ASTM F1390 and, the risk of breaking substrates during processing especially for large diameter substrates.

In processes according to the prior art substrate with different thicknesses have to be handled. The present invention makes it possible to simplify the process so that only substrates with a certain thickness have to be handled.

SUMMARY

It is an object of the present invention to obviate at least some of the disadvantages in the prior art and provide an improved method of manufacturing device wafers in SiC.

In a first aspect there is provided a method for manufacturing a SiC device wafer comprising the steps:
  a. slicing and polishing a SiC boule crystal to obtain a substrate having a first surface and a second surface opposite to the first surface,
  b. processing the first surface of the substrate, to create a device wafer on the substrate,
  c. removing the device wafer, the device wafer comprises a part of the substrate, leaving the other part of the substrate as a remaining substrate, said remaining substrate still having a first surface and a second surface opposite to the first surface,
  d. adding SiC to the remaining substrate so that the original thickness of the substrate is essentially restored, wherein the SiC is added to the second surface,
  e. repeating steps b)-d) at least once.

In a second aspect there is provided a SiC device wafer manufactured according to the method as described above.

The wafering loss in producing substrates from a SiC boule is reduced considerably, in one embodiment described in the text it is reduced with about 50% for slicing a boule into 1000 μm thick substrate wafers compared to slicing it into 350 μm thick substrate wafers.

Advantages include that thick substrates are more stable in processing, especially in high temperature processes like implant activation anneal, epitaxial growth, and thermal oxidation.

The fabrication of thick substrates might increase the TTV (total thickness variation) of the wafers, but it can at the same time reduce warp and bow. Hence, the overall geometrical quality of the wafers could be higher, which makes it easier to process them in production tools with automatic wafer handling. This is especially important for wafer diameters of 150 mm and higher.

Epi growth is usually increasing warp and bow due to stress coming from the doping difference (substrate is highly doped, drift layers are lowly doped). The increase in warp and bow depends on the thickness and doping of the drift layers in relation to the thickness and doping of the substrate. For thick, low-doped drift layers the increase in warp and bow can be significant. The usage of thick substrates will reduce this effect.

The usage of thick substrates is also reducing the risk for breakage of the wafers during wafering processes like grinding and polishing and in processing where high stress can be present.

The process can be adapted so that the thickness of the substrate does not vary, when measured after the addition of further material. This makes it easier to handle the substrates and to make equipment for handling the substrates during the manufacturing process.

BRIEF DESCRIPTION OF THE DRAWINGS

The invention is described with reference to the following drawings in which.

DETAILED DESCRIPTION

Figure 1:
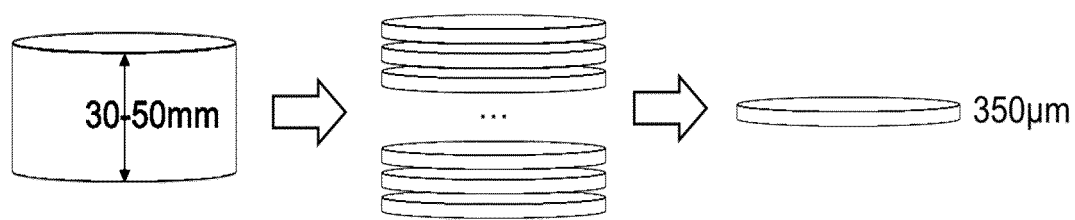
FIG. 1 shows a method as commonly used in the state of the art. SiC substrates with thickness of 350 μm are manufactured from a boule crystal of SiC by slicing using e.g. a wire saw followed by polishing the substrate surfaces.

Before the invention is disclosed and described in detail, it is to be understood that this invention is not limited to particular compounds, configurations, method steps, substrates, and materials disclosed herein as such compounds, configurations, method steps, substrates, and materials may vary somewhat. It is also to be understood that the terminology employed herein is used for the purpose of describing particular embodiments only and is not intended to be limiting since the scope of the present invention is limited only by the appended claims and equivalents thereof.

It must be noted that, as used in this specification and the appended claims, the singular forms "a", "an" and "the" include plural referents unless the context clearly dictates otherwise.

If nothing else is defined, any terms and scientific terminology used herein are intended to have the meanings commonly understood by those of skill in the art to which this invention pertains.

"Epitaxial" as used throughout the description and the claims denotes that the material has been manufactured with epitaxial growth, in this case epitaxial growth of SiC.

"Substrate" as used throughout the description and the claims denotes a piece of material on which a device is built up.

"Device wafer" as used throughout the description and the claims denotes a SiC wafer with processed devices on one surface and at least a part of the substrate on the opposite surface.

"Wafering loss" as used throughout the description and the claims denotes the sum of the kerf loss and the polishing loss. Kerf loss is the loss that occurs due to the sawing of the substrates and polishing loss is the loss that occurs due to polishing.

In a first aspect there is provided a method for manufacturing a SiC device wafer comprising the steps:
  a. slicing and polishing a SiC boule crystal to obtain a substrate having a first surface and a second surface opposite to the first surface,
  b. processing the first surface of the substrate, to create a device wafer on the substrate, c. removing the device wafer, the device wafer comprises a part of the substrate, leaving the other part of the substrate as a remaining substrate, said remaining substrate still having a first surface and a second surface opposite to the first surface, d. adding SiC to the remaining substrate so that the original thickness of the substrate is essentially restored, wherein the SiC is added to the second surface, e. repeating steps b)-d) at least once.

The invention minimizes the material waste in today's SiC device wafer production and increases the number of produced device wafers per grown SiC boule crystal, in some embodiments by a factor 2-3. The idea according to a first part of the invention is to use thick (>1 mm or 0.7-2 mm) substrate instead of today's 350 µm thick substrates in the device wafer fabrication. This reduces the wafering loss considerably in substrate fabrication.

A second important part of the invention is that the part of the substrate, which is not necessary for the device is removed in a late stage of the device wafer fabrication process. The removed substrate is refurbished in terms of thickness and surface finish, e.g. by growing a SiC layer on the backside and optionally CMP polishing of the front side, and used again in the device wafer fabrication process. This cycle is in one embodiment repeated until the remaining thickness of the original thick substrate is below the thickness needed for the device wafer. In this way, the number of device wafers per boule can be significantly increased.

The boule crystal can typically be 30-50 mm thick and is sliced and polished using conventional and known methods in the art. Examples include slicing by wire saw. The obtained substrates are in one embodiment, thicker than normally used today.

On the obtained substrate there is manufactured a device with commonly available methods. In one embodiment there is added at least one layer of SiC by epitaxial growth. It is also possible to subject the device wafer to various other methods in order to create the desired device. Additions are made so that the desired device can be made.

When the device has been made on the substrate, then the device as well as a part of the substrate is removed by splitting the remaining part of the substrate off using laser irradiation followed by a separation process. This is done by a known and commercially available method where a separation layer is formed at a specified depth by irradiating the second surface of the device wafer with a high power laser. The device wafer, i.e. the at least one added layer and a part of the substrate, is removed by this slicing method. Conventional laser processes are not suitable for this type of slicing because the separation layer formed by laser irradiation in conventional processes extends in the direction of the laser incident downwards from the surface. However, since SiC can be transformed into an amorphous state through decomposition by a focused laser; and since the light absorption coefficient for such an irradiated material is approx. 100,000 times larger than that of crystalline SiC, it is possible to create a separation layer parallel to the surface and relatively close to the surface, so that a thin wafer can be sliced off from a thick substrate. Such process can be applied to monocrystal ingots and wafers, regardless of the off-angle of the crystal c-axis.

After the separation, the remaining substrate is refurbished so that SiC is added to restore the substrate to its original thickness. This substrate may also be referred to as a refurbished substrate. It is an advantage to restore the thickness to the original thickness because the machinery for processing substrates in to device wafers can then easier be adapted to handle one single thickness. The substrate with the added SiC (i.e. the refurbished substrate) is subjected to the process again starting from step b), where the first surface of the substrate is processed to create a device wafer on the substrate. After removing the device wafer in step c) a new first surface is created on the remaining substrate.

In the art it is known to add new material on a substrate on the same side as the side where the device is to be made. For instance in US 20190067425 it is disclosed that SiC is applied on the opposite side compared to the side where the component is. In such a process the equipment has to be able to handle substrate with different thicknesses. Further the applied SiC has to be of sufficiently high quality so that the device wafer can be manufactured of the added SiC. Addition of SiC of sufficiently high quality may be expensive and complicated. Thus the equipment does not have to be adapted for substrates with varying thicknesses. Further the quality of the applied SiC does not have to be as high as the standard required for the device wafer. Addition of inexpensive lower quality SiC is possible.

In one embodiment removing the device wafer in step c) is made by using laser light, wherein step c) comprises irradiating a layer in the substrate with laser so that a plurality of modifications occur in the crystal structure in the layer, and so that the crystal fissures because of the modifications in the layer, so that the device wafer can be removed. In one embodiment, a pulsed laser is used. The laser is in one embodiment focused on many points in the layer one by one so that a plurality of modifications in the crystal structure occurs. The crystal fissures where the crystal structure has been modified, i.e. in the layer. When the crystal has fissured in the layer, the device wafer can be removed. Sometimes a slight force is necessary to remove the device wafer. The device wafer includes a part of the substrate. The layer where the separation occurs is in the substrate. The plane of the layer is normally chosen to be parallel to the planes of the first and second surfaces of the substrate. The planes of the first and second surfaces are normally parallel.

In one embodiment, the processing in step b) comprises use of epitaxial growth and optionally other techniques to obtain the desired device. In one embodiment the processing of the first surface of the substrate in step b) comprises epitaxial growth and optionally other techniques to obtain the desired device wafer. Typically, several steps are required to manufacture a device wafer as desired. The step of manufacturing the device is well known and is carried out according to known methods for device manufacture.

Any suitable device can be created on the SiC substrate with known methods. Examples of the processing in step b) includes one or more selected from processing steps such as epitaxial growth, ion implantation, oxidation, dielectrics deposition, contact formation, and metallizations. Typically, several of the above processing steps are combined in step b) to create a device wafer.

In one embodiment, the layer added in step d) comprises SiC of arbitrary quality and structure, and wherein steps b)-d) are repeated no more than until the substrate from step a) has been made into device wafers. This is a way of utilizing the material in the original substrate optimally. The added SiC can be of a cheaper quality which cannot or should not be used in the device layer(s) itself but which is sufficient for a substrate. Thereby the entire or almost the entire original substrate can be utilized, which is an advantage considering the cost of the material. This refurbishing alternative comprises a fast and cost-effective growth of a low-quality layer in step d). In this case, the surface does not have to be prepared "epi-ready" and the growth can be done e.g. at high growth rate, low temperature, and without caring much about the layer quality. A poly-SiC layer could be good enough. Alternative equivalent materials are also encompassed for the addition, including materials other than SiC. The substrate refurbishing process to select for a certain fabricated device depends inter alia on the voltage class and correspondingly on the drift layer thickness. For low voltage devices (<2 kV, <20 μm drift layer) this embodiment might be more beneficial and cost effective.

In an alternative embodiment, the layer added in step d) is SiC of such a quality and structure that it can be used for a device substrate and wherein steps b)-d) are repeated. By adding SiC of sufficiently high quality it is possible to use it for the device itself. By this approach more SiC is added and device wafers can be sliced off until crystal defects or imperfections in the crystal are limiting the device yield of the device wafer. If no defects are introduced or if the crystal quality is not worsened, the process can continue forever in theory, but in practice, it is realistic to expect that the device wafer manufacturing process has to be interrupted after a period of time when imperfections in the crystal become yield limiting followed by re-starting it with a new thick substrate. In case, one wants to close the manufacturing loop, then the layer grown in step d) should be of high quality. In this case, the surface needs to be prepared "epi-ready" so that a high quality layer is grown in the substrate refurbishing process. In this case, a lot more device wafers can be produced from the original thick substrate. Limitation is the achievable quality of the refurbish-growth-process. For high voltage devices (>5 kV, >50 μm drift layer), this embodiment could be more cost effective as the used thickness of the original thick substrate is lower.

During step d) the thickness of the substrate is restored to its original value or essentially its original value because it is easier to adapt the process to a setup where the substrates are equally thick. Thus the equipment utilized does not have to be adapted to a varying thickness. A skilled person realizes that some smaller variations may be accepted in the substrate thickness and thus the word essentially should be interpreted as a certain tolerance. The substrate thickness in this context refers to the thickness after step d), i.e. a refurbished substrate. In one embodiment, the substrate thickness after step d) is within ±5% of the value of the original substrate. In another embodiment, the substrate thickness after step d) is within ±10% of the value of the original substrate. In yet another embodiment, the substrate thickness after step d) is within ±20 μm of the value of the original substrate. In a further embodiment, the substrate thickness after step d) is within ±50 μm of the value of the original substrate.

The SiC is added in step d) to the second surface.

In one embodiment, the thickness of the substrate provided in step a) is in the interval 700-2000 μm. In one embodiment it is 1000 μm or larger. Such a thickness gives a strength and stability so that it is easy to handle the substrate, especially for larger substrate, 150 mm in diameter and larger.

In one embodiment, the substrate is polished during step d) or between steps d) and e). The polishing ensures a surface of sufficiently high smoothness for the next layer(s) to be added. If a surface which is not smooth enough is the result of the substrate removal process in step c), then polishing should be used before the next layer is added. The polishing can be made after step d), or during step d) or before new SiC is added in step d), or any combination of those.

In a second aspect there is provided a SiC device wafer manufactured according to the method as described above.

Figure 2:
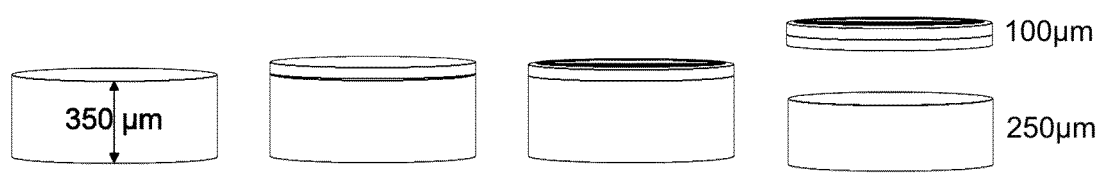
FIG. 2 shows a method according to the state of the art where a 350 μm thick substrate is utilized for the manufacture of a device wafer. A layer is added on the substrate, typically involving epitaxial growth, but other technologies may also be involved to create the layer(s) of the device. When the device wafer is ready processed, a part of the substrate is removed from the device wafer by grinding. For example, if the final device wafer should have a thickness of 100 μm, 250 μm of the original substrate wafer is removed by costly and time-consuming grinding.
Figure 3:
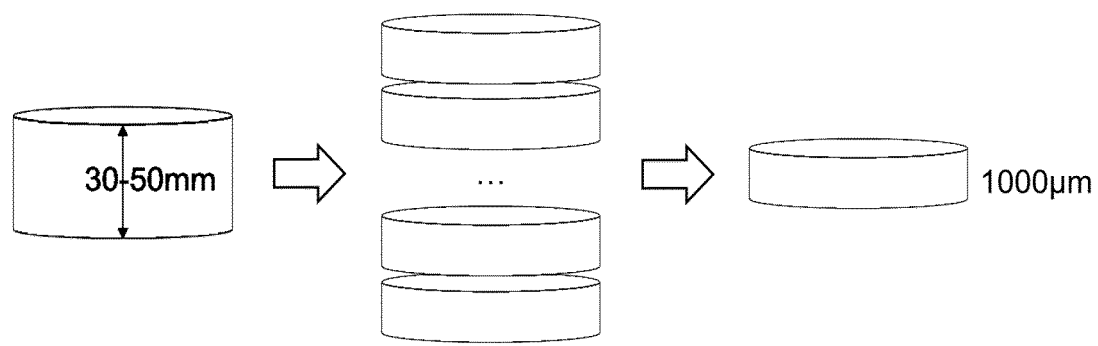
FIG. 3 shows a method according to the invention where a boule crystal of SiC is sliced into substrates with a greater thickness than normally used in the art, in this case 1000 μm, followed by polishing the substrate surfaces.
Figure 4:
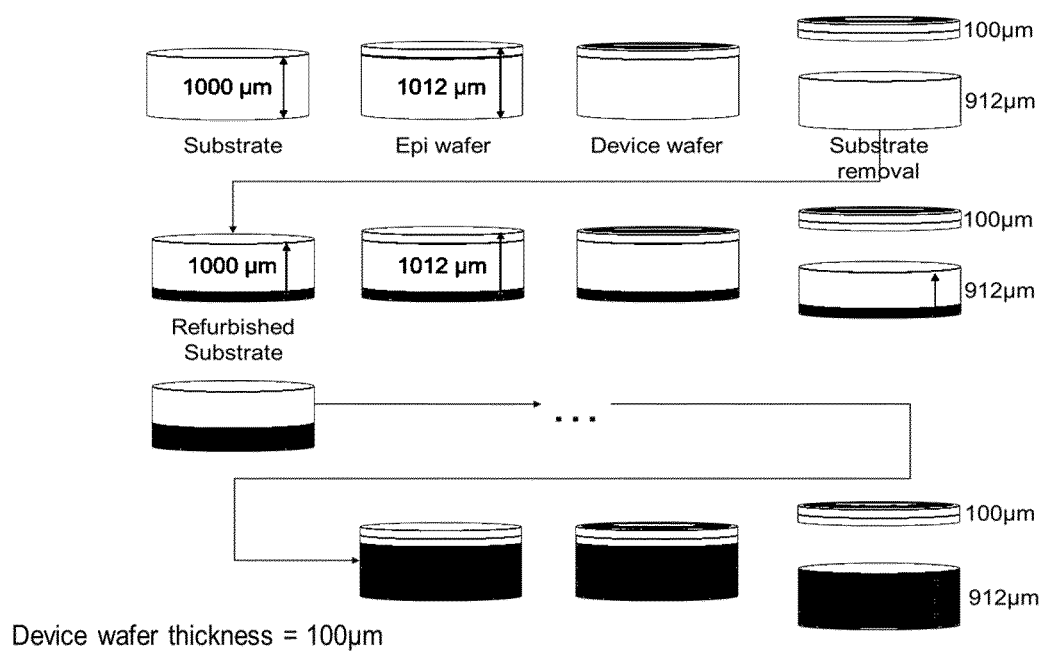
FIG. 4 shows in the uppermost panel from the left to the right a method according to the invention where a 1000 μm thick substrate is used when adding a 12 μm layer with epitaxial growth to create a device wafer. A 100 μm thick device wafer is removed using laser light leaving a 912 μm thick remaining substrate, this process may be referred to as laser lift-off or laser slicing. In the second panel from above from left to right, the remaining substrate is treated to add SiC. The substrate may now be referred to as a refurbished substrate and is in this embodiment 1000 μm thick as its original thickness. Again, a 12 μm thick layer is added using epitaxial growth to create a device wafer. Another 100 μm thick device wafer is removed using laser light leaving a 912 μm thick remaining substrate. In the bottom panel, this process is repeated until the original 1000 μm thick substrate is used.

The invention is now described further with reference to a particular embodiment depicted in FIGS. 3-4 and compared with the state of the art in FIGS. 1-2.

The following parameters are used for the comparison: Wafering loss per substrate wafer: 300 μm (Kerf loss per wafer: 180 μm, Polishing loss per wafer: 120 μm), Substrate wafer thickness after sawing: 470 μm, Device wafer thickness: 100 μm, Device wafer loss/substrate removal (grinding): 250 μm.

| Boule size (mm) | # 350 μm wafers (100% yield) | Substrate manufacturing: Material loss per boule (100% yield) (mm) | # device wafers per boule (100% yield) | Device wafer manufacturing: Material loss per boule (100% yield) (mm) | Total material loss per boule (100% yield) (mm) | Effective boule thickness used for device wafer production (100% yield) (mm) |
|---|---|---|---|---|---|---|
| 30 | 46 | 13.9 | 46 | 11.5 | 25.4 | 4.6 (15%) |
| 40 | 61 | 18.7 | 61 | 15.2 | 33.9 | 6.1 (15%) |
| 50 | 76 | 23.4 | 76 | 19.0 | 42.4 | 7.6 (15%) |

Table 1 shows the material loss according to the prior art for a typical embodiment as depicted in FIGS. 1-2. The effective boule thickness used for device wafer production is only 15% of the original SiC boule.

If the present invention is used the material loss will be reduced considerably if an embodiment according to the invention as depicted in FIGS. 3-4 is used instead. The wafer thickness is 1000 μm and the device wafer loss is 80 μm per wafer due to polishing during refurbishing.

| Boule size (mm) | # 1000 μm wafers (100% yield) | Substrate manufacturing: Material loss per boule (100% yield) (mm) | # device wafers per boule (100% yield) | Device wafer manufacturing: Material loss per boule (100% yield) (mm) | Total material loss per boule (100% yield) (mm) | Effective boule thickness used for device wafer production (100% yield) (mm) |
| --- | --- | --- | --- | --- | --- | --- |
| 30 | 23 | 7.0 | 138 | 11.0 | 18.0 | 12.0 (39.9%) |
| 40 | 30 | 10.0 | 180 | 14.4 | 24.4 | 15.6 (39.0%) |
| 50 | 38 | 12.0 | 228 | 18.2 | 30.2 | 19.8 (39.5%) |

Table 2 shows the material loss according to the invention for an embodiment as depicted in FIGS. 3-4. As can be seen the total material loss per SiC boule is reduced by about 30% and the effective boule thickness used for device wafer production is increased to about 40%, which is a considerable advantage not least with regard to the material cost.

The total material loss per SiC boule can be even reduced by about 45%, if the kerf loss of sawing the boule into wafers can be avoided e.g. by using laser slicing for the thick substrate manufacturing. In this case, the effective boule thickness used for device wafer production is over 45%.

The invention claimed is:

1. A method for manufacturing a plurality of SiC device wafers comprising the steps:
   a. providing a SiC substrate having a first surface and a second surface opposite to the first surface;
   b. processing the first surface of the substrate to create a SiC device wafer on the substrate;
   c. removing the SiC device wafer, wherein the SiC device wafer comprises a part of the substrate, and leaving the other part of the substrate as a remaining substrate, the remaining substrate having a new first surface opposite to the second surface;
   d. adding SiC to the remaining substrate wherein the SiC is added to the second surface and
   e. repeating steps (b) through (d) at least once.

2. The method according to claim 1, wherein removing the SiC device wafer in step (c) comprises irradiating a layer in the substrate using laser light to fissure the SiC substrate due to a plurality of modifications occurring in a crystal structure in the layer so that the device wafer can be removed.

3. The method according to claim 1, wherein the processing of the first surface of the substrate in step (b) comprises using at least one of epitaxial growth, ion implantation, oxidation, dielectrics deposition, contact formation, and/or metallizations to create the device wafer.

4. The method according to claim 1, wherein adding the SiC to the remaining substrate in step (d) comprises adding a layer of the SiC of arbitrary quality and structure, and wherein repeating steps (b) through (d) comprises repeating steps (b) through (d) no more than until the SiC substrate provided in step (a) has been made into a plurality of the SiC device wafers.

5. The method according to claim 1, wherein an original thickness of the substrate provided in step (a) is in an interval 700-2000 μm.

6. The method according to claim 1, comprising polishing the substrate during step (d) or between steps (d) and (e).

7. A plurality of SiC device wafers manufactured according to the method of claim 1.

8. The method according to claim 1, wherein a diameter of the SiC substrate obtained in step (a) is about 150 mm or larger.

9. The method according to claim 1, wherein a substrate thickness after step d) is within ±10% of a thickness of the SiC substrate provided in step a).

10. The method according to claim 1, wherein the substrate thickness after step d) is within ±50 μm of a thickness of the SiC substrate provided in step a).

11. The method according to claim 1, wherein the steps (b) through (d) are repeated until a thickness of the substrate provided in step a) is less than a cumulation of added substrate from of the repetition step (d).

12. The method according to claim 1, wherein the added substrate of step (d) is "epi-ready".

13. The method according to claim 1, wherein the added substrate of step (d) is not "epi-ready" and of a lower quality than the substrate provided in step a).

14. The method according to claim 1, wherein providing a SiC substrate comprises slicing a SiC boule crystal.

15. The method according to claim 14, wherein the SiC boule crystal has thickness from about 30 mm to about 50 mm.

* * * * *